United States Patent
Cheng et al.

(10) Patent No.: US 9,263,352 B2
(45) Date of Patent: Feb. 16, 2016

(54) SINGULATION APPARATUS COMPRISING AN IMAGING DEVICE

(71) Applicants: Chi Wah Cheng, Tsing Yi (HK); Hoi Shuen Tang, Kwai Chung (HK); Chun Kit Liu, Tsuen Wan (HK)

(72) Inventors: Chi Wah Cheng, Tsing Yi (HK); Hoi Shuen Tang, Kwai Chung (HK); Chun Kit Liu, Tsuen Wan (HK)

(73) Assignee: ASM TECHNOLOGY SINGAPORE PTE LTD, Singapore (SG)

( * ) Notice: Subject to any disclaimer, the term of this patent is extended or adjusted under 35 U.S.C. 154(b) by 36 days.

(21) Appl. No.: 14/146,875

(22) Filed: Jan. 3, 2014

(65) Prior Publication Data

US 2015/0194354 A1     Jul. 9, 2015

(51) Int. Cl.
| | |
|---|---|
| H01L 21/00 | (2006.01) |
| B26D 5/20 | (2006.01) |
| H01L 21/66 | (2006.01) |
| H01L 21/67 | (2006.01) |
| H01L 21/78 | (2006.01) |
| B26D 5/00 | (2006.01) |
| B26D 5/06 | (2006.01) |
| B26D 1/18 | (2006.01) |
| H01L 21/68 | (2006.01) |

(52) U.S. Cl.
CPC .......... *H01L 22/20* (2013.01); *B26D 1/18* (2013.01); *B26D 5/007* (2013.01); *B26D 5/06* (2013.01); *H01L 21/67092* (2013.01); *H01L 21/67259* (2013.01); *H01L 21/681* (2013.01); *H01L 21/78* (2013.01); *Y10T 83/162* (2015.04)

(58) Field of Classification Search
CPC .................... H01L 21/3043; B23D 59/003
USPC ......................................................... 438/110
See application file for complete search history.

(56) References Cited

U.S. PATENT DOCUMENTS

| | | | | |
|---|---|---|---|---|
| 6,192,289 | B1* | 2/2001 | Geffen et al. | 700/121 |
| 6,348,943 | B1* | 2/2002 | Huang | G01D 5/342 348/92 |
| 2001/0029938 | A1* | 10/2001 | Arai et al. | 125/13.01 |
| 2003/0060022 | A1* | 3/2003 | Peng | B23D 59/002 438/460 |
| 2003/0073382 | A1* | 4/2003 | Manor | B23D 59/001 451/6 |
| 2004/0025322 | A1* | 2/2004 | Binnard | 29/592.1 |
| 2005/0009302 | A1* | 1/2005 | Wakui et al. | 438/464 |

* cited by examiner

*Primary Examiner* — Caridad Everhart
(74) *Attorney, Agent, or Firm* — Ostrolenk Faber LLP

(57) ABSTRACT

Disclosed is a singulation apparatus for cutting a workpiece. The singulation apparatus comprises: i) a processor; ii) at least one chuck device for securing the workpiece to be cut; iii) a cutting device spaced from the at least one chuck device by a separation distance, the cutting device being for cutting the workpiece secured to the at least one chuck device; and iv) an imaging device operable to capture one or more images comprising the cutting device and a reference feature. In particular, the processor is configured to determine a separation distance between the cutting device and the reference feature based on the one or more images as captured by the imaging device, to thereby determine the separation distance between the cutting device and the workpiece as secured to the at least one chuck device.

19 Claims, 4 Drawing Sheets

SINGULATION APPARATUS COMPRISING AN IMAGING DEVICE

FIELD OF THE PRESENT INVENTION

This invention relates to a singulation apparatus with an imaging device.

BACKGROUND OF THE INVENTION

In the semiconductor industry, singulation or dicing devices are used for cutting semiconductor wafers or packaged semiconductor devices along a lattice of cutting lines. The cutting lines define boundaries between individual electronic devices on a semiconductor wafer. Dicing is also known as singulation or die cutting. A singulation device includes a number of components including a chuck device having a support surface for holding a workpiece being cut, and a cutting blade including a spindle and a blade rotatably mounted on the spindle.

It is important to control and maintain an accurate cutting depth of the workpiece by the cutting blade—if the cutting blade is spaced further away from the workpiece than anticipated, the workpiece would be insufficiently cut by the cutting blade due to an insufficient cutting depth; on the other hand, if the cutting blade is spaced nearer to the workpiece than anticipated, the chuck device would be damaged by the cutting blade. More specifically, the positional accuracy of the cutting blade should be in the range of a few microns to ensure precision of the singulation process. There are however various factors affecting a separation distance between the cutting blade and the chuck device (and thereby the workpiece) which might in turn affect the cutting depth of the workpiece by the cutting blade—first, dynamic positional changes of the components of the singulation device; and second, wearing of the cutting blade due to continuous use. Thus, it is desirable to periodically determine the separation distance between the cutting blade and the workpiece to ensure an accurate cutting depth of the workpiece, prior to the workpiece being cut.

Conventionally, non-contact methods are used to determine the separation distance between the cutting blade and the workpiece. One example of such non-contact methods may include: i) a collimated light emitter for emitting light; ii) a collimated light receiver for receiving the light from the collimated light emitter; and iii) mirrors for reflecting the light from the collimated light emitter to the collimated light receiver. In particular, the light from the collimated light emitter converges midway between the mirrors at a point below a cutting tip of the cutting blade and above the chuck device. During detection, the cutting blade moves downwards slowly until the tip of the cutting blade just crosses the position where the light from the collimated light emitter is converged by the mirrors. At this point, the collimated light receiver detects a reduction in the amount of light received—which allows the position of the tip of the cutting blade relative to the chuck device and, accordingly, the separation distance between the tip of the cutting blade and the workpiece to be determined.

One major disadvantage of the above non-cutting method is the slowness in measuring the position of the cutting blade, which reduces the production efficiency (or units-per-hour, UPH) of the singulation device. In order to obtain measurements with accuracy in the range of a few microns, it is necessary for the cutting blade to move very slowly towards the light-converging point. If the cutting blade advances too fast, the tip of the cutting blade will overshoot beyond the light-converging point, thereby causing the measurement to be inaccurate.

In addition, the measurement process ought to be repeated to ensure repeatability—and thus reliability—of earlier measurement(s). Thus the entire duration usually takes around 20-30 seconds, which significantly reduces the production efficiency of the singulation device. As the unit size of electronic devices in a wafer or a package strip becomes smaller with advancing technology, it is common to perform around 5-10 cycles of measurements per package strip to ensure repeatability of the results. Consequently, the entire duration for the above non-contact method to obtain measurements is further lengthened, thus exacerbating the reduction of the production efficiency of the singulation device.

Thus it is an object of the present invention to propose a singulation apparatus that ameliorates the limitation of the above conventional non-contact method.

SUMMARY OF THE INVENTION

A first aspect of the invention is a singulation apparatus for cutting a workpiece. The singulation apparatus comprises: i) a processor; ii) at least one chuck device for securing the workpiece to be cut; iii) a cutting device spaced from the at least one chuck device by a separation distance, the cutting device being for cutting the workpiece secured to the at least one chuck device; and iii) an imaging device operable to capture one or more images comprising the cutting device and a reference feature. In particular, the processor is configured to determine a separation distance between the cutting device and the reference feature based on the one or more images as captured by the imaging device, to thereby determine the separation distance between the cutting device and the workpiece as secured to the at least one chuck device.

A second aspect of the invention is a method of determining a separation distance between a workpiece secured to a chuck device and a cutting device for cutting the workpiece in a singulation apparatus. The method comprises the steps of: capturing one or more images comprising the cutting device and a reference feature; determining the separation distance between the cutting device and the reference feature based on the one or more images as captured; and thereby determining the separation distance between the cutting device and the workpiece as secured to the chuck device.

A third aspect of the invention is a method of calibrating a singulation apparatus, wherein the singulation apparatus comprises i) a cutting device for cutting a workpiece and ii) at least one chuck device for securing the workpiece to be cut. Such a method comprises the steps of: positioning the cutting device to define a known separation distance between the cutting device and a reference feature; capturing one or more images comprising the reference feature and the cutting device spaced from the reference feature by the known separation distance; and determining from the one or more images captured, the number of pixels corresponding to the known separation distance between the cutting device and the reference feature, to derive a pixel-distance correlation factor.

BRIEF DESCRIPTION OF THE DRAWINGS

Preferred embodiments of the invention will now be described, by way of example only, with reference to the accompanying figures, of which.

DETAILED DESCRIPTION OF THE PREFERRED EMBODIMENTS

Figure 1:
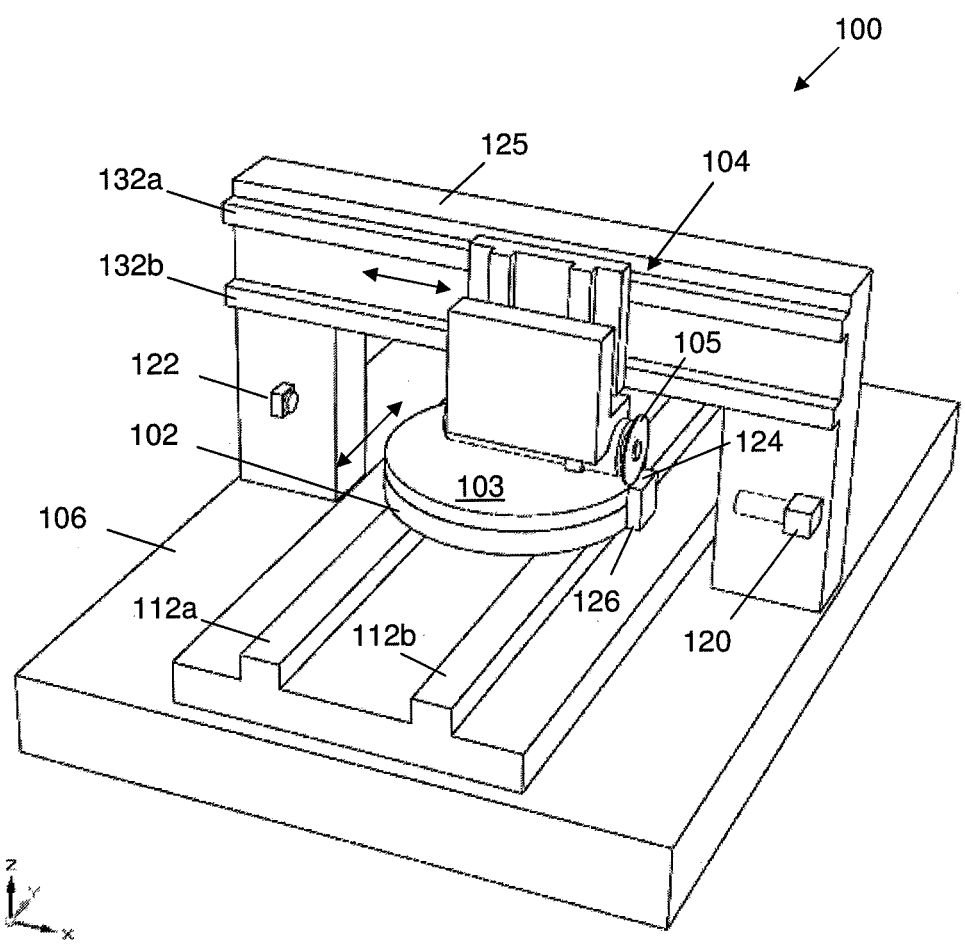
FIG. 1 is a perspective view of a singulation device according to a first embodiment of the invention, comprising a chuck device for securing a workpiece, a cutting device for cutting the workpiece and an imaging device for capturing images.

FIG. 1 is a perspective view of a singulation (or dicing) device 100 with a chuck table 106 and a movable chuck device 102 with a supporting surface 103 for supporting and securing a workpiece (not shown), according to a first embodiment of the invention. Examples of the workpiece include a semiconductor wafer and a packaged semiconductor device. The chuck device 102 is captured to and travels along a pair of parallel rails 112a and 112b in a feed direction which is designated as Y. Extending above the chuck device 102 is a bridge 125 where a pair of parallel rails 132a and 132b extends along the length of a side of the bridge 125. Mounted for movement along the rails 132a, 132b is a cutting device 104 for cutting the workpiece.

The cutting device 104 comprises a base captured to rails 132a, 132b and a motorized platform mounted to the base for linear movement relative thereto in an up-and-down direction, that is the direction designated as Z in FIG. 1. The platform carries a motorized spindle, at one end of which is mounted a rotatable circular cutting blade 105. The position of the platform in the Z-direction, and thus the height of the spindle and the cutting blade 105, can be adjusted with precision by a processor (FIG. 2: '202') to control the depth of cut into the workpiece. The base is also motorized such that the position of the cutting device 104 can be adjusted along the rails 132a, 132b in the direction designated as X (i.e., transversely to the feed direction Y). The cutting device 104 also includes at least one camera or other sensor fixed to the movable platform and facing towards the workpiece. The sensors are used for cutline recognition and alignment in a manner which is known in the art.

In addition, the singulation device 100 shown in FIG. 1 also includes a blade height measurement device comprising: i) an imaging device 120 (for example, a CCD camera or a laser scanner) for capturing images; and ii) an optional backlighting device 122 for illuminating the background of the images as captured by the imaging device 120. Additionally, the processor 202 is configured to perform image processing of the images captured by the imaging device 120 to determine the relative position between the cutting device 104 and the workpiece as secured on the supporting surface 103 of the chuck device 102.

Further, the blade height measurement device requires a reference level against which the level of a tip of the cutting blade 105 is compared, in order to determine the relative position between the tip of the cutting blade 105 and the workpiece in the Z-direction. Referring to FIG. 1, the reference level corresponds to a top surface 124 of a reference table 126, which is fixedly connected to a side of the chuck device 102. The top surface 124 of the reference table 126 is spaced from the supporting surface 103 of the chuck device 102 by a certain positional relation, whereby the top surface 124 is at a higher level than the supporting surface 103 of the chuck device 102. More preferably, even when the workpiece is placed on the chuck device 102, the top surface 125 of the reference table 126 should still assume a higher level than the top surface of the workpiece along the Z-axis. This will allow the blade height measurement device to determine the position of the tip of the cutting blade 105 relative to the workpiece in the Z-direction during operation of the singulation device 100 whenever needed (more details below). Accordingly, the positional relation between the reference level of the reference table 126 and the supporting surface 103 of the chuck device 102 should be determined during setup of the singulation device 100—as will now be described.

Figure 2:
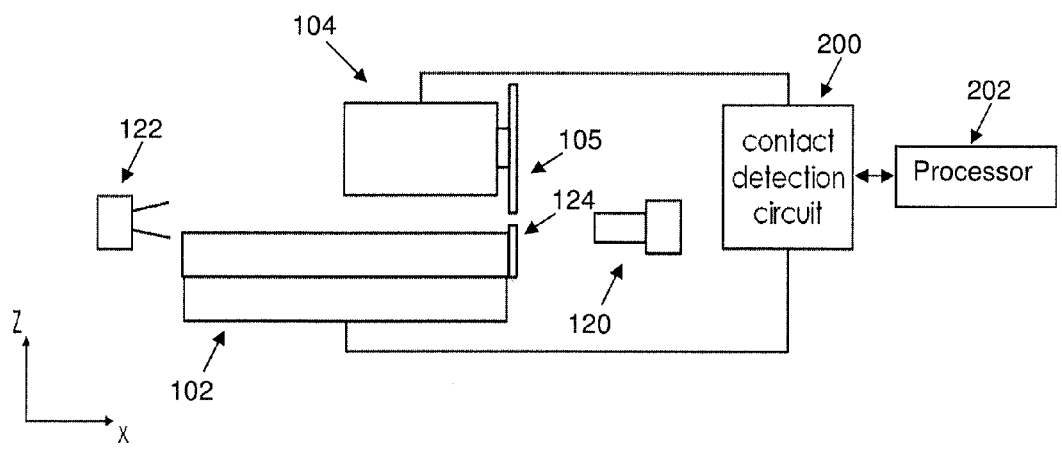
FIG. 2 is a side view of the singulation device of FIG. 1 as viewed along a feeding direction of the chuck device.

FIG. 2 shows a side view of the singulation device 100 of FIG. 1 when viewed along the feeding direction of the chuck device 102. During setup of the singulation device 100, the cutting device 104 is first controlled by the processor 202 to position above the (empty) chuck device 102, before it is moved downwards in the Z-direction until the tip of the cutting blade 105 is brought into contact with the supporting surface 103 of the chuck device 102. By using a linear encoder, the position of the cutting device 104 along the Z-axis can be determined. Since the cutting blade 105 and the supporting surface 103 are both made of metallic materials and connected to a contact detection circuit 200, an electrical current flow between them upon contact is detected by the processor 202 that is connected to the contact detection circuit 200. As such, the level of the supporting surface 103 of the chuck device 102 along the same Z-axis can be determined from the position of the cutting device 104 along the Z-axis at the point of detecting the presence of an electrical current flow.

The cutting device 104 is then controlled by the processor 202 to position above the top surface 124 of the reference table 126, before it is moved downwards once again in the Z-direction until the tip of the cutting blade 105 is brought into contact with the top surface 124 of the reference table 126. The top surface 124 of the reference table 126 is made of a metallic material—like the cutting blade 105—and is connected in series with the chuck device 102 to the contact detection circuit 200. Thus an electrical current flows between the cutting blade 105 and the reference table 126 upon contact, which allows the position of the top surface 124 of the reference table 126 in the Z-direction to be determined from the position of the cutting device 104 in the Z-direction at the point of detecting the presence of an electrical current flow.

By determining the Z-level difference between the supporting surface 103 of the chuck device 102 and the top surface 124 of the reference table 126 as derived above, their positional relation (in the Z-direction) can be determined during setup of the singulation device 100.

After the positional relation between the reference level and the supporting surface 103 of the chuck device 102 is determined, the blade height measurement device is next calibrated.

Calibration of the blade height measurement device involves configuring the processor 202 to position the cutting device 204 at a known vertical distance along the Z-axis above the top surface 124 of the reference table 126 as earlier detected. Preferably, the cutting device 104 is positioned to define a predetermined gap (for example, 1 mm) between the tip of the cutting blade 105 and the top surface 124 of the reference table 126. Thereafter, the imaging device 120 is activated to capture one or more images comprising portions of the tip of the cutting blade 105 and the top surface 124 of the reference table 126. The backlighting device 122 is also switched on, so as to provide a sharper image contrast of the images when captured by the imaging device 120.

Figure 3:
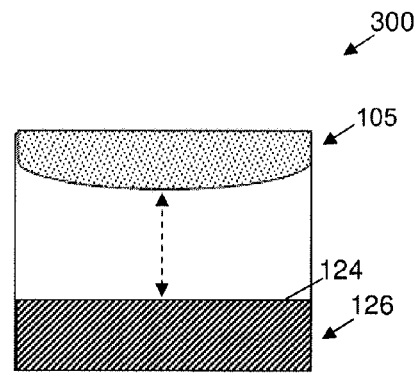
FIG. 3 shows an exemplary image captured by the imaging device.

FIG. 3 shows an exemplary image 300 that is captured by the imaging device 120. It should be noted that the images captured by the imaging device 120 should allow the processor 202 to analyse the pixel details—in particular, the number of pixels—relating to the separation distance between the tip of the cutting blade 105 and the top surface 124 of the reference table 126. In this way, a correlation between the number of image pixels corresponding to the aforesaid separation distance and the actual spatial distance of the cutting blade 105 from the top surface 124 of the reference table 126 can be derived. For example, the processor 202 may determine a certain number of pixels between the tip of the cutting blade 105 and the top surface 124 of the reference table 126 in an image taken by the imaging device 120. Assuming that this certain number of pixels is 20 and that the actual separation distance between the tip of the cutting blade 105 and the top surface 124 of the reference table 126 is 1 mm along the Z-axis, 20 pixels would thus represent an actual distance of 1 mm. Accordingly each pixel height along the Z-axis would represent an actual distance of 1 mm/20=0.05 mm or 50 mm, and a pixel-distance correlation is thus derived. For accuracy, multiple images may be captured by the imaging device 120 to ensure repeatability and, thereby, reliability of the said pixel-distance correlation. It should of course be appreciated that the resolution of the images as captured by the imaging device 120 could also be enhanced to increase the accuracy of the pixel-distance correlation.

With the derived pixel-distance correlation, the singulation apparatus 100 is capable of determining the height of the cutting blade 105 during operation of the singulation device 100 whenever necessary. Likewise, this is done by moving the tip of the cutting blade 105 to a position above the top surface 124 of the reference table 126 and, subsequently, activating the imaging device 120 to capture one or more images comprising portions of the tip of the cutting blade 105 and the top surface 124 of the reference table 126. By analyzing the number of image pixels corresponding to the separation distance between the tip of the cutting blade 105 and the top surface 125 of the reference table 126, the actual position of the tip of the cutting blade 105 relative to the top surface 124 of the reference table 126 can be determined. With the positional relation between the reference level of the reference table 126 and the supporting surface 103 of the chuck device 102 being already determined during setup of the singulation device 100, the actual position of the tip of the cutting blade 105 relative to the workpiece as secured to the supporting surface 103 of the chuck device 102 can also be determined accordingly, because the thickness of the workpiece should also be known.

Thus, the derived pixel-distance correlation provides a much shorter duration for obtaining the desired measurements as compared with the known non-contact method described earlier, and this advantageously improves the production efficiency (or UPH) of the singulation device 100.

Although the first embodiment above describes the use of a separate reference table to provide a reference level, it should be appreciated that this is not necessary since the reference level in other embodiments of the invention may correspond to a part of the supporting surface 103 of the chuck device 102 which is not covered by a workpiece during operation. In those other embodiments, it will not be necessary to determine any positional relation between the supporting surface 103 of the chuck device 102 and the reference level, since the reference level itself is already part of the supporting surface 103 of the chuck device 102.

Figure 4:
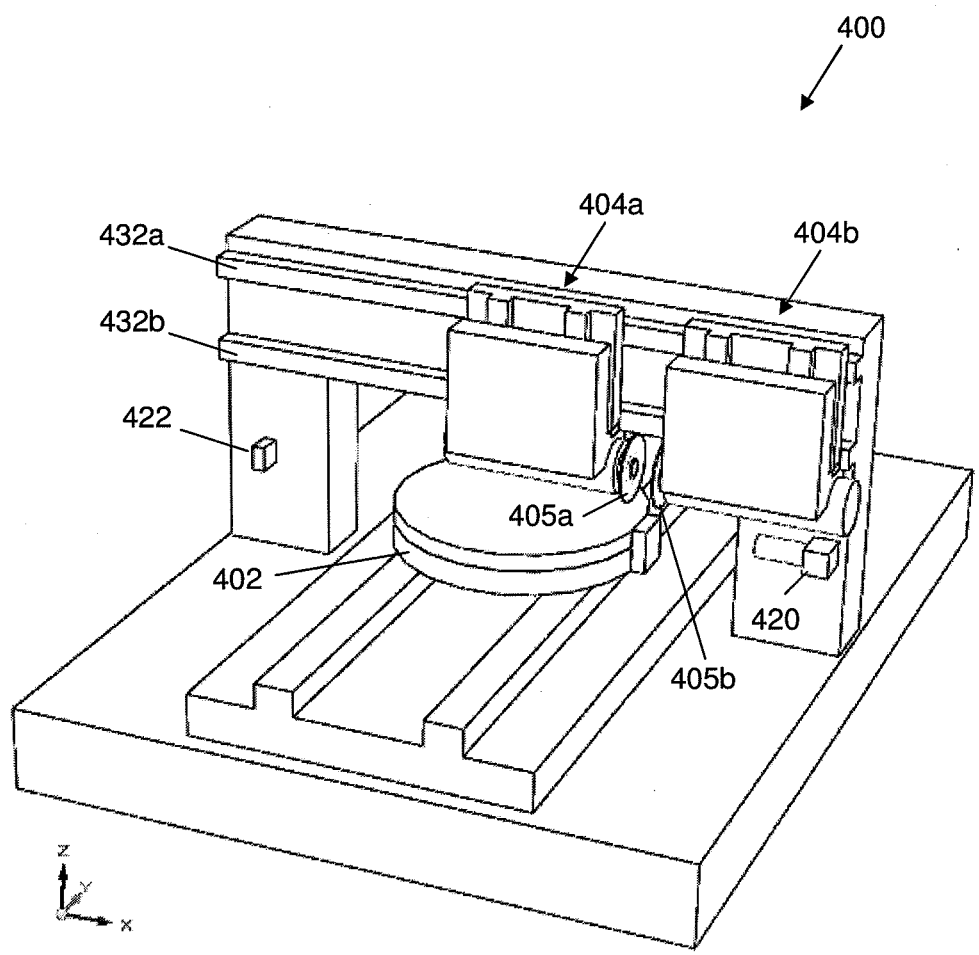
FIG. 4 is a perspective view of a singulation device according to a second embodiment of the invention, comprising two cutting devices.

FIG. 4 shows a perspective view of another singulation device 400, according to a second embodiment of the invention. The singulation device 400 of FIG. 4 is of similar construction to that of FIG. 1. For instance, the singulation device 400 of FIG. 4 also includes: a chuck device 402 for securing a workpiece; a cutting device for cutting the workpiece; a blade height measurement device comprising: i) an imaging device 420 (for example, a CCD camera or a laser scanner) for capturing images; and ii) an optional backlighting device 422 for illuminating the background of the images as captured by the imaging device 420; and a processor for analyzing the images captured by the imaging device 420 to determine the position of the cutting device relative to the workpiece as secured to the chuck device 402.

In contrast to the singulation device 100 of FIG. 1, however, its cutting device comprises a pair of cutting members 404a, 404b for cutting the workpiece. In particular, the spindles of the cutting members 404a, 404b are arranged such that their respective circular cutting blades 405a, 405b face towards each other. Accordingly, the distance between the respective cutting blades can be adjusted to be very small.

Like the cutting device 104 of the singulation device 100 of FIG. 1, each cutting member 404a, 404b comprises a base captured to rails 432a, 432b and a motorized platform mounted to the base for linear movement relative thereto in an up-and-down direction, that is the direction designated as Z in FIG. 4. The respective platform carries a motorized spindle, at one end of which is mounted a rotatable circular cutting blade 405a, 405b. The position of the platform in the Z-direction, and thus the height of the spindle and the respective cutting blade 405a, 405b can be adjusted with precision by the processor to control the depth of cut into the workpiece.

Thus the respective heights of the cutting blades 405a, 405b relative to the supporting surface of the chuck device 402 can be determined, as described earlier. It should, however, be noted that when the imaging device 420 is activated to capture one or more images comprising portions of the tip of one of the cutting blades 405a, 405b, the latter should preferably be lowered so that the respective other cutting blade 405a, 405b does not block the bottommost tip of its cutting blade during imaging by the imaging device 420. Otherwise, the measurements would be inaccurate.

Figure 5:
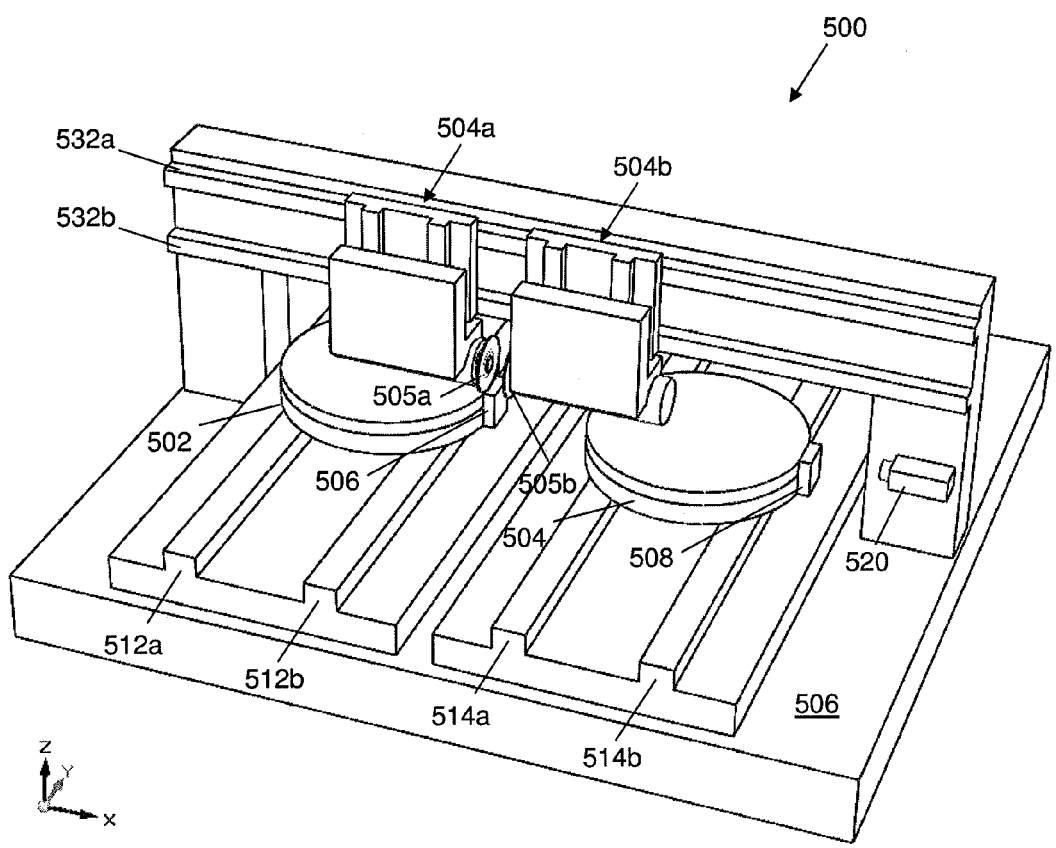
FIG. 5 is a perspective view of a singulation device according to a second embodiment of the invention, comprising two chuck devices and two cutting devices.

FIG. 5 shows a perspective view of a further singulation device 500, according to a third embodiment of the invention. The singulation device 500 of FIG. 5 is of similar construction to that of FIG. 1 and FIG. 4. For instance, the singulation device 500 of FIG. 5 includes a cutting device comprising a pair of cutting members 504a, 504b for cutting one or more workpieces; a blade height measurement device comprising an imaging device 520 (for example, a CCD camera or a laser scanner) for capturing images; and a processor for analyzing the images captured by the imaging device 520 to determine the position of the cutting device.

Like the cutting members 404a, 404b of the singulation device 400 of FIG. 4, each cutting member 504a, 504b comprises a base captured to rails 532a, 532b and a motorized platform mounted to the base for linear movement relative thereto in an up-and-down direction, that is the direction designated as Z in FIG. 5. The respective platform carries a motorized spindle, at one end of which is mounted a rotatable circular cutting blade 505a, 505b. The position of the platform in the Z-direction, and thus the height of the spindle and the respective cutting blade 505a, 505b can be adjusted with precision by the processor to control the depth of cut into the workpiece.

In contrast to the singulation devices 100, 400 of FIGS. 1 and 4, however, the singulation device 500 of FIG. 5 comprises two chuck devices 502, 504. The first chuck device 502 is captured to and travels along a pair of parallel rails 512a, 512b in a feed direction which is designated as Y. The second chuck device 504 is similar and is captured to and travels along a pair of parallel rails 514a, 514b in feed direction Y. The chuck devices 502, 504 are arranged side-by-side on a chuck table 506. The chuck devices 502, 504 also comprise respective reference tables 506, 508 for use in determining a relative position between a cutting tip of any of the cutting blades 505a, 505b and a workpiece as secured to any of the supporting surfaces of the chuck devices 502, 504.

Thus the respective heights of the cutting blades 505a, 505b relative to the supporting surface of the chuck device can be determined, as described earlier. It should, however, be noted that when the imaging device 520 is activated to capture one or more images comprising portions of the tip of one of the cutting blades 505a, 505b, the latter should preferably be lowered so that the respective other cutting blade 505a, 505b does not block the bottommost tip of its cutting blade for imaging by the imaging device 420. Otherwise, the measurements would be inaccurate.

Various modifications and variations of the above embodiments are possible without departing from the scope of the invention. The reference table 106 of the singulation device 100 of FIG. 1 may also be fixedly connected to the opposite side of the chuck device 102. It should again be appreciated that the use of a separate reference table to provide a reference level is optional since the reference level in some other embodiments of the invention may correspond to a portion of the supporting surface 103 of the chuck device 102 which is not covered by a workpiece during operation. In those embodiments, it will not be necessary to determine any positional relation between the supporting surface 103 of the chuck device 102 and a separate reference level.

The invention claimed is:

1. A singulation apparatus for cutting a workpiece, comprising:
   a processor;
   at least one chuck device for securing the workpiece to be cut;
   a cutting device spaced from the at least one chuck device by a separation distance, the cutting device being for cutting the workpiece secured to the at least one chuck device;
   a reference feature that is separate from the workpiece; and
   an imaging device operable to capture one or more images comprising the cutting device and the reference feature,
   wherein the processor is configured to determine a separation distance between the cutting device and the reference feature based on the one or more images as captured by the imaging device, to thereby determine the separation distance between the cutting device and the workpiece as secured to the at least one chuck device.

2. The singulation apparatus of claim 1, wherein the reference feature is arranged in relation to the at least one chuck device by a known positional relation.

3. The singulation apparatus of claim 1, wherein the reference feature is part of the at least one chuck device.

4. The singulation apparatus of claim 1, wherein the imaging device is a camera.

5. The singulation apparatus of claim 1, wherein the imaging device is a laser scanner.

6. The singulation apparatus of claim 1, wherein the cutting device comprises a circular rotatable blade for cutting the workpiece.

7. The singulation apparatus of claim 1, wherein the processor is configured to determine from the one or more images captured by the imaging device, the number of pixels corresponding to the separation distance between the cutting device and the reference feature, and apply a pixel-distance correlation factor to the determined number of pixels to determine the separation distance between the cutting device and the reference feature.

8. The singulation apparatus of claim 7, wherein
   the cutting device is configured to be positioned to define a known separation distance between the cutting device and the reference feature;
   the imaging device is configured to capture one or more images comprising the reference feature and the cutting device spaced from the reference feature by the known separation distance; and
   the processor is configured to determine from the one or more images captured by the imaging device, the number of pixels corresponding to the known separation distance between the cutting device and the reference feature, to derive the pixel-distance correlation factor.

9. The singulation apparatus of claim 8, wherein the known separation distance is 1 mm.

10. A method of determining a separation distance between a workpiece secured to a chuck device and a cutting device for cutting the workpiece in a singulation apparatus, the method comprising the steps of:
    capturing one or more images comprising the cutting device and a reference feature, the reference feature being separate from the workpiece; and
    determining the separation distance between the cutting device and the reference feature based on the one or more images as captured; and thereby
    determining the separation distance between the cutting device and the workpiece as secured to the chuck device.

11. The method of claim 10, wherein the reference feature is arranged in relation to the chuck device.

12. The method of claim 10, wherein the reference feature is part of the chuck device.

13. The method of claim 10, wherein the step of determining the separation distance between the cutting device and the reference feature comprises the steps of:
    determining the number of pixels corresponding to the separation distance between the cutting device and the reference feature from the one or more images captured by the imaging device; and
    applying a pixel-distance correlation factor to the determined number of pixels to determine the separation distance between the cutting device and the reference feature.

14. The method of claim 13, further comprising the steps of:
    positioning the cutting device to define a known separation distance between the cutting device and a reference feature;
    capturing one or more images comprising the reference feature and the cutting device spaced from the reference feature by the known separation distance; and
    determining from the one or more images captured, the number of pixels corresponding to the known separation distance between the cutting device and the reference feature, to derive the pixel-distance correlation factor.

15. The method of claim 14, wherein the known separation distance is 1 mm.

16. A method of calibrating a singulation apparatus, the singulation apparatus comprising i) a cutting device for cutting a workpiece and ii) at least one chuck device for securing the workpiece to be cut, the method comprising the steps of:

positioning the cutting device to define a known separation distance between the cutting device and a reference feature, the reference feature being separate from the workpiece;

capturing one or more images comprising the reference feature and the cutting device spaced from the reference feature by the known separation distance; and determining from the one or more images captured, the number of pixels corresponding to the known separation distance between the cutting device and the reference feature, to derive a pixel-distance correlation factor.

17. The method of calibrating the singulation apparatus of claim 16, wherein the known separation distance is 1 mm.

18. The method of calibrating the singulation apparatus of claim 16, wherein the reference feature is arranged in relation to the at least one chuck device by a known positional relation.

19. The method of calibrating the singulation of claim 16, wherein the reference feature is part of the at least one chuck device.

\* \* \* \* \*